(12) United States Patent
Kusunoki

(10) Patent No.: US 6,467,066 B2
(45) Date of Patent: Oct. 15, 2002

(54) SEMICONDUCTOR DEVICE SIMULATION METHOD, SEMICONDUCTOR DEVICE SIMULATOR, COMPUTER PROGRAM FOR SEMICONDUCTOR DEVICE SIMULATION, AND METHOD OF MANUFACTURING THE SEMICONDUCTOR DEVICE

(75) Inventor: Naoki Kusunoki, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 13 days.

(21) Appl. No.: 09/833,761

(22) Filed: Apr. 13, 2001

(65) Prior Publication Data

US 2001/0032330 A1 Oct. 18, 2001

(30) Foreign Application Priority Data

Apr. 14, 2000 (JP) ........................................ 2000-112928

(51) Int. Cl.$^7$ ................................................ G06G 7/48
(52) U.S. Cl. .................................. 716/4; 716/5; 716/13
(58) Field of Search .............................. 703/3, 4, 5, 13, 703/14

(56) References Cited

U.S. PATENT DOCUMENTS

| | | | | | |
|---|---|---|---|---|---|
| 5,761,481 A | * | 6/1998 | Kadoch et al. | ................. | 703/2 |
| 5,845,105 A | * | 12/1998 | Kunikiyo et al. | ............... | 703/6 |
| 5,886,905 A | * | 3/1999 | Yokozawa | .................... | 703/14 |
| 5,896,303 A | * | 4/1999 | Furkay et al. | ................. | 703/5 |
| 5,918,036 A | | 6/1999 | Matsubara | .................. | 395/500 |
| 6,349,271 B1 | * | 2/2002 | Akiyama | ...................... | 703/13 |

FOREIGN PATENT DOCUMENTS

JP 9-320986 12/1997

OTHER PUBLICATIONS

P. Fornara et al.; "Modeling of Local Reduction in TiSi2 and CoSi2 Growth Near Spacers in MOS Technologies: Influence of Mechanical Stress and Main Diffusing Species" IEDM96–73; pp. 3.5.1—3.5.4.

C.M. Osburn et al.; "Perdict 1.6: Modeling of Metal Silicide Processes"; J. Electrochem. Soc., vol. 140, No. 12; pp. 3660—3667 (Dec. 1993).

* cited by examiner

Primary Examiner—Son Mai
(74) Attorney, Agent, or Firm—Finnegan, Henderson, Farabow, Garrett & Dunner, L.L.P.

(57) ABSTRACT

A simulation method simulates a self-aligned silicide (SALICIDE) process according to heat treatment temperature and changes in the composition of a silicide film during first and second heat treatments. The simulation method separately simulates silicide reactions in the first and second heat treatments according to species (metal or silicon) diffusing through a silicide, to thereby improve the accuracy of simulations.

20 Claims, 7 Drawing Sheets

SEMICONDUCTOR DEVICE SIMULATION METHOD, SEMICONDUCTOR DEVICE SIMULATOR, COMPUTER PROGRAM FOR SEMICONDUCTOR DEVICE SIMULATION, AND METHOD OF MANUFACTURING THE SEMICONDUCTOR DEVICE

CROSS REFERENCE TO RELATED APPLICATIONS

This application claims benefit of priority under 35 USC 119 to Japanese Patent Application No. P2000-112928 filed on Apr. 14, 2000, the entire contents of which are incorporated by refer herein.

BACKGROUND OF THE INVENTION

1. Field of the Invention

The present invention relates to a technique of two- or three-dimensionally simulating conditions for manufacturing a semiconductor device, and a method of manufacturing a semiconductor device based on data provided by the simulation. In particular, the present invention relates to a semiconductor device simulation method for handling changes in the geometries of silicide reactive areas, a simulator for achieving the simulation method, and a simulation program for specifying various functions achieved by the simulator.

2. Description of the Related Art

A self-aligned silicide (SALICIDE) process is a semiconductor processing technique to reduce the gate resistance and source/drain resistance of a semiconductor device. The SALICIDE process forms a silicide film on gate electrodes and source/drain diffusion layers in a self-aligning manner. The SALICIDE process employs, for example, cobalt (Co) and involves two step anneal. The first beat treatment uses a relatively low temperature to form a cobalt monosilicide film, i.e., a CoSi film between a Co film and a silicon (Si) material such as a silicon substrate. The second beat treatment uses a relatively high temperature to form a cobalt disilicide film, i.e., a $CoSi_2$ film on the Si material. In this way, the cobalt SALICIDE process forms two silicide films, i.e., CoSi and $CoSi_2$ films having different states and compositions on a silicon material.

A related art simulates the cobalt SALICIDE process by considering only the formation of $CoSi_2$ without paying attention to the formation of CoSi.

This type of related art is described in "Modeling of Local Reduction in $TiSi_2$ and $CoSi_2$ Growth Near Spacers in MOS Technologies: Influence of Mechanical Stress and Main Diffusing Species" by P. Fomara, A. Poncet et. al in IEDM, 1996, pp. 73–76.

Figure 1:
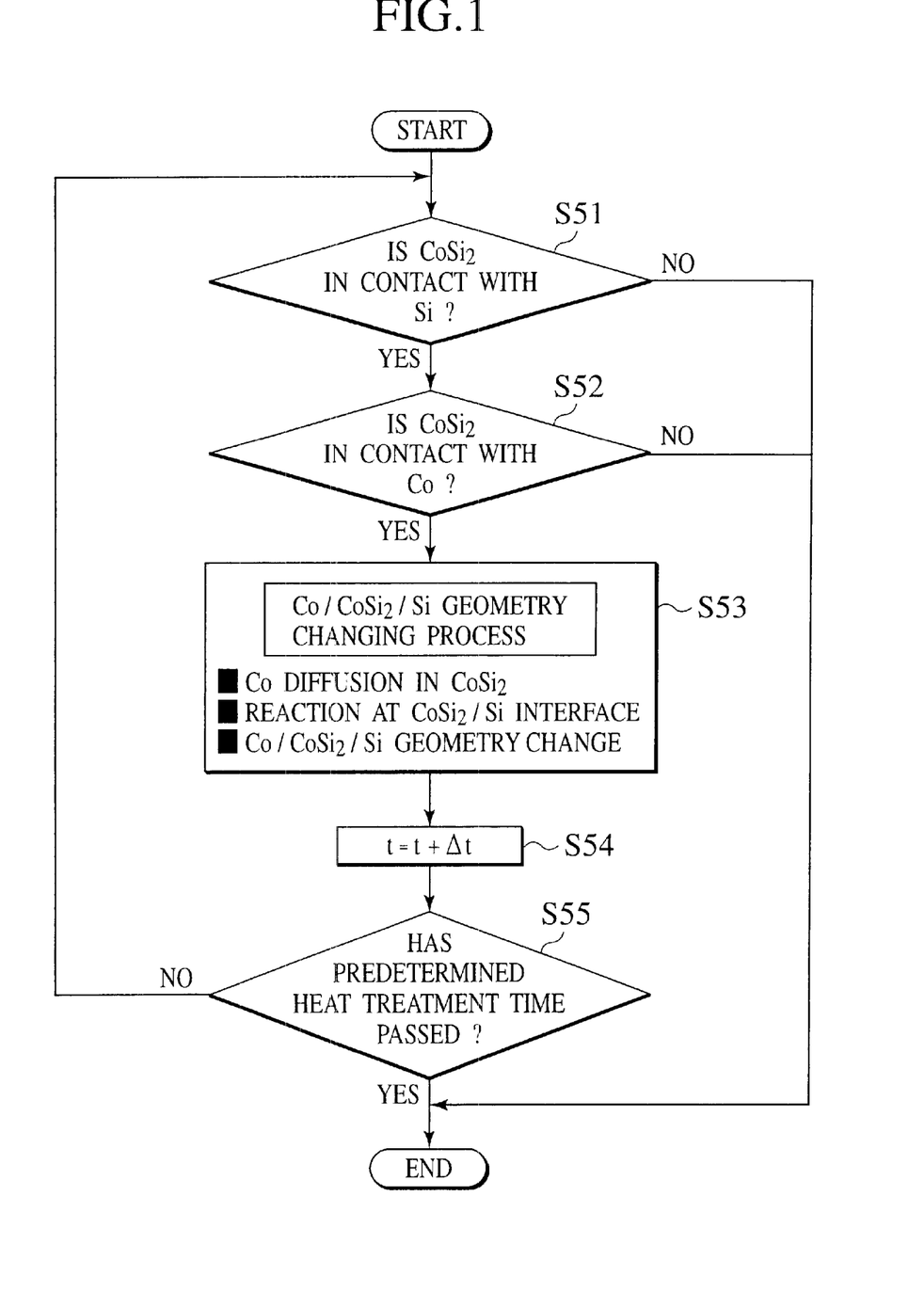
FIG. 1 is a flowchart of a cobalt SALICIDE simulation according to the related art that considers only a first heat treatment to form $CoSi_2$.

FIG. 1 is a flowchart showing the related art of simulating the cobalt SALICIDE process.

Step S51 determines whether or not a cobalt disilicide ($CoSi_2$) film is in contact with the silicon (Si) material, and step S52 determines whether or not the $CoSi_2$ film is in contact with the cobalt (Co) film. If the $CoSi_2$ film is in contact with both the Si material and Co film, step S53 computes a diffusion equation of Co diffusing through $CoSi_2$ and geometry changing equations expressing the geometric changes of the Co film, $CoSi_2$ film, and Si material, and changes the geometries of the Co film, $CoSi_2$ film, and Si material accordingly.

Step S54 increments time by $\Delta t$. Step S55 determines whether or not a predetermined heat treatment time has passed. If not, the flow returns to step S51, and steps S51 to S53 are repeated at intervals of $\Delta t$. If step S55 determines that the predetermined heat treatment time has passed, the simulation provides final element geometries.

As mentioned above, the actual SALICIDE process involves a first heat treatment of forming CoSi and a second heat treatment of forming $CoSi_2$. However, the related art simulates only the formation of $CoSi_2$ based on one of the first and second heat treatments. CoSi and $CoSi_2$ are formed through different physical phenomena, and if the CoSi forming stage is ignored, silicide reactions will incorrectly be simulated. In particular, the related art involves inaccuracy when simulating silicide film thicknesses and element geometries in the SALICIDE process by using different heat treatment conditions.

The related art also involves inaccuracy when calculating interface movements caused by silicide reactions. This leads to inaccurate calculations of stress and point defects caused in a silicon material due to the interface movements.

BRIEF SUMMARY OF THE INVENTION

An object of the present invention is to provide a simulation method capable of correctly simulating silicide film thicknesses and element geometries, allowing the speedy selection of proper process parameters, reducing the numbers of prototypes and tests, shortening a development period, and improving development efficiency. Also provided are a simulator for executing the simulation method, a simulation program for realizing functions of the simulation method, and a semiconductor manufacturing method employing the simulation method.

In order to accomplish the objects, a first aspect of the present invention provides a simulation method comprising a first step of determining whether or not a silicide region (which may be in the form of a film and is made of a metal and silicon) is in contact with a silicon region (which is made of silicon) and a metal region (which may be in the form of a film and is made of this metal); a second step of determining, if the silicide region is in contact with the metal and silicon regions, the species diffusing through the silicide region according to a temperature heating the silicide, metal, and silicon regions and the composition of the silicide region; a third step of finding, if the species diffusing rough the silicide region is silicon, it's positional relationships among the metal, silicide, and silicon regions according to a first diffusion equation expressing diffusion of silicon through the silicide region and geometry changing equations expressing geometric changes of the metal, silicide, and silicon regions; and a fourth step of finding, if the species diffusing through the silicide region is the metal, positional relationships among the metal, silicide, and silicon regions according to a second diffusion equation expressing diffusion of the metal through the silicide region and geometry changing equations expressing geometric changes of the metal, silicide, and silicon regions.

The composition of the silicide region is expressed as $M_ySi_x$ where x and y indicate a coupling state of metal M and silicon Si that form the silicide.

The first aspect of the present invention simulates the SALICIDE process by separately considering silicide reactions caused by first and second heat treatments. This reduces the number of process parameters, prototypes and tests, shortens the development period, and improves development efficiency.

A second aspect of the present invention provides a simulator having first means for determining whether or not a silicide region (which may be in the form of a film and is made of a metal and silicon) is in contact with a silicon region (which is made of silicon) and a metal region (which may be in the form of a film and is made of this metal); second means for determining, if the silicide region is in contact with the metal region and the silicon region, the species diffusing through the silicide region according to a temperature heating the silicide, metal and silicon regions and the composition of the silicide region; third means for finding, if the species diffusing through the silicide region is silicon, it's positional relationships among the silicide, metal, and silicon regions according to a first diffusion equation expressing diffusion of silicon through the silicide region and geometry changing equations expressing geometric changes of the silicide, metal, and silicon regions; and fourth means for finding, if the species diffusing through the silicide region is the metal, it's positional relationships among the silicide, metal, and silicon regions according to a second diffusion equation expressing the diffusion of the metal through the silicide region and geometry changing equations expressing geometric changes of the silicide, metal, and silicon regions.

The simulator of the second aspect accurately calculates silicide region thicknesses and element geometries, reduces the number of pros parameters, prototypes, and tests, shortens a development period, and increases development efficiency.

A third aspect of the present invention provides a simulation program having a first computer readable program code which determines whether or not a silicide region (which may be in the form of a film and is made of a metal and silicon) is in contact with a silicon region (which is made of silicon) and a metal region (which may be in the form of a film and is made of this metal); a second computer readable program code which determines, if the silicide region is in contact with the metal and the silicon regions, the species diffusing through the silicide region according to a temperature heating the silicide, metal, and silicon regions and the composition of the silicide region; a third computer readable program code which finds, if the species diffusing through the silicide region is silicon, positional relationships among the silicide, metal, and silicon regions according to a first diffusion equation expressing diffusion of silicon through the silicide region and geometry changing equations expressing geometric changes of the silicide, metal, and silicon regions; and a fourth computer readable program code which finds, if the species diffusing through the silicide region is the metal, positional relationships among the silicide, metal, and silicon regions according to a second diffusion equation expressing diffusion of the metal through the silicide region and geometry changing equations expressing geometric changes of the silicide, metal, and silicon regions.

The third aspect of the simulation program accurately calculates silicide region thicknesses and element geometries, reduces the number of process parameters, prototypes, and tests, shortens a development period, and increases development efficiency.

A fourth aspect of the present invention provides a method of manufacturing a semiconductor device, having a first procedure including a first act of determining whether or not a silicide region (which may be in the form of a film and is made of a metal and silicon) is in contact with a silicon region (which is made of silicon) and a metal region (which may be in the form of a film and is made of the metal); a second act of determining, if the silicide region is in contact with the metal and silicon regions, the species diffusing through the silicide region according to a temperature heating the silicide, metal, and silicon regions and the composition of the silicide region; a third act of finding, if the species diffusing through the silicide region is silicon, positional relationships among the silicide, metal, and silicon regions according to a first diffusion equation expressing diffusion of silicon through the silicide region and geometry changing equations expressing geometric changes of the silicide, metal, and silicon regions; and a fourth act of finding, if the species diffusing though the silicide region is the metal, positional relationships among the silicide, metal, and silicon regions according to a second diffusion equation expressing the diffusion of the metal through the silicide region and geometry changing equations expressing geometric changes of the silicide, metal, and silicon regions; a second procedure of finding the electric characteristics of the semiconductor device according to given electric boundary conditions and semiconductor element structural data based on the found positional relationships among the silicide, metal, and silicon regions; and a third procedure of executing a series of manufacturing processes including a silicide process on a semiconductor material according to a result of evaluation of the found electric characteristics, thereby manufacturing the semiconductor device.

The fourth aspect of the semiconductor device manufacturing method drastically shortens a period from study (designing) to development including precision simulations of a semiconductor device.

Other and further objects and features of the present invention will become obvious upon an understanding of the illustrative embodiments about to be described in connection with the accompanying drawings or will be indicated in the appended claims, and various advantages not referred to herein will be apparent to one skilled in the art upon employing of the invention in practice.

DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Physical Phenomenon of Silicide Process

Before explaining the embodiments of the present invention, an actual silicide process will be explained. The silicide process produces a silicide film due to silicide reactions (physical phenomena) between a metal film and a silicon (Si) material such as a silicon substrate. In the following explanation, a metal that forms the metal film is cobalt (Co) as an example. A cobalt silicide is expressed as $CoSi_x$, i.e., $Co_ySi_x$ with a variable y being 1.

The cobalt silicide process involves two step anneal as mentioned above. The first heat treatment forms a monosilicide (CoSi) at a relatively low temperature of 450° C. to 500° C.

Unreacted Co is removed, and the second heat treatment is carried out at a temperature of about 700° C. to form a disilicide ($CoSi_2$).

Physical phenomena of the two step anneal will be explained.

(1) In the first heat treatment, a CoSi film is formed between the Co film and the Si material. Silicon in the Si material diffuses through the CoSi film toward the Co film, the diffused Si reacts with the Co film along an interface between the Co film and the CoSi film, to produce the CoSi film. This silicide reaction is expressed as Co (1.00)+Si (1.81)→CoSi(1.98). Namely, the silicide reaction consumes Co of 1 and Si of 1.81, to produce CoSi of 1.98.

(2) In the second heat treatment, a $CoSi_2$ film is formed between the CoSi film and the Si material, Co in the CoSi film which is generated by the reaction expressed as $2CoSi \rightarrow Co+CoSi_2$ diffuses through the $CoSi_2$ film toward the Si material, and the diffused Co reacts with the Si material along an interface between the $CoSi_2$ film and the Si material, to produce the $CoSi_2$ film. This silicide reaction is expressed as Co (1.00)+2Si (3.63)→$CoSi_2$(3.49). Namely, the silicide reaction consumes Co of 1 and Si of 3.63, to produce $CoSi_2$ of 3.49.

In this way, the two step anneal involve different species diffusing through the silicide film and different interfaces to produce the silicide film. As a result, the two physical phenomena consume different quantities of Co and Si to produce the silicide film.

Accordingly, the embodiments of the present invention separately handle the first and second heat treatments when simulating the silicide process.

First Embodiment

A method of simulating a silicide process of a semiconductor device according to the first embodiment of the present invention will be explained. In the embodiment, a variable x in $CoSi_x$ is a real value in the range of 1<=x<=2, and an analysis domain is a two-dimensional domain.

Figure 2:
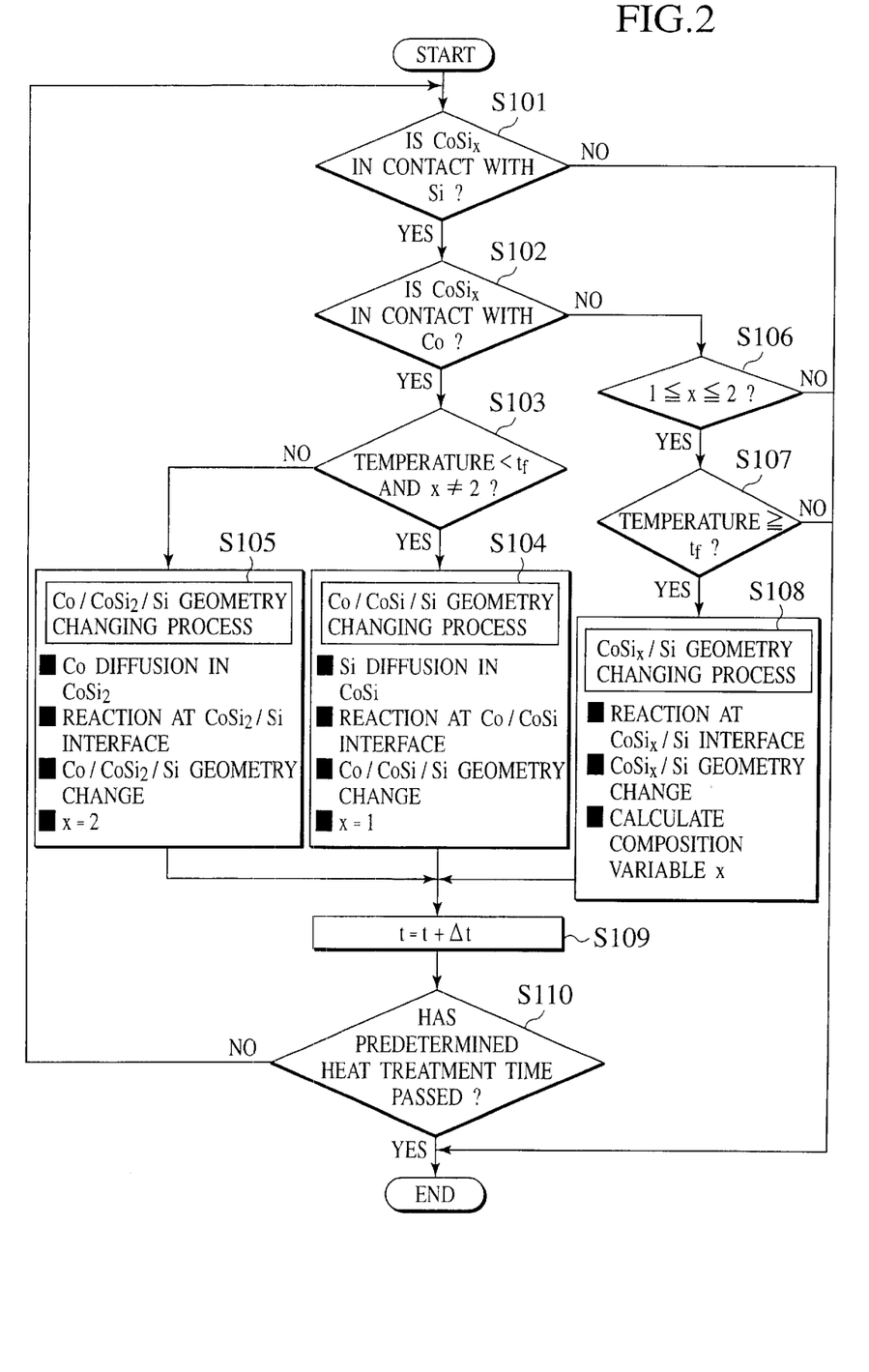
FIG. 2 is a, flowchart of a cobalt SALICIDE simulation according to a first embodiment of the present invention that separately considers first and second heat treatments to form a silicide.

FIG. 2 is a flowchart showing the simulation method of the first embodiment. The details of the simulation method will be explained.

(a) Step S101 determines whether or not a $CoSi_x$ film, which may be a $CoSi_x$ region, etc., is in contact with a silicon (Si) region, which may be a silicon substrate, a polycrystal silicon film, or an amorphous silicon etc. If the $CoSi_x$ film is not in contact with the Si region, no silicide reaction occurs, and therefore, the simulation ends. If the $CoSi_x$ film is in contact with the Si region, step S102 is carried out.

(b) Step S102 determines whether or not the $CoSi_x$ film is in contact with a cobalt (Co) film, which may be a cobalt region, etc. If the $CoSi_x$ film is in contact with a Co film, step S103 is carried out.

(c) Step S103 determines whether or not a heat treatment temperature is below a set temperature tf and x is not equal to 2. For the sake of simulation accuracy, the temperature tf is set to 550° C. at which $CoSi_2$ is formed. If step S103 is YES, step S104 is carried out, and if NO, step S105 is carried out.

(d) Step S104 solves a diffusion equation of Si diffusing through CoSi and geometry changing equations expressing geometric changes of the Co film, CoSi film, and Si region due to the silicide reaction.

(e) Step S105 solves a diffusion equation of Co diffusing through $CoSi_2$ and geometry changing equations expressing geometric changes of the Co film, silicide film, and Si region.

(f) If step S102 is NO and indicates that the $CoSi_x$ film is not in contact with the Co film, step S106 determines whether or not the variable x of $CoSi_x$ is equal to or greater than 1 and smaller than 2 if step S106 is YES, step S107 is carried out.

(g) Step S107 determines whether or not the heat treatment temperature is greater than the set temperature tf. If step S107 is YES, step S108 is carried out. If steps S106 and S107 are each NO, no silicide reaction occurs, and the simulation ends.

(h) Step S118 processes the geometries of the $CoSi_x$ film and Si region. The details of this will be explained later with reference to FIG. 3.

(i) After steps S104, S105, and S108, step S109 increments time by Δt Step S110 checks to see if a predetermined heat treatment time has passed. If step S110 is NO, the flow returns to step 5101, and steps 5101 to 5108 are repeated at intervals of Δt until the heat treatment time passes. If step S110 is YES, the simulation provides final element geometries and ends.

Figure 3:
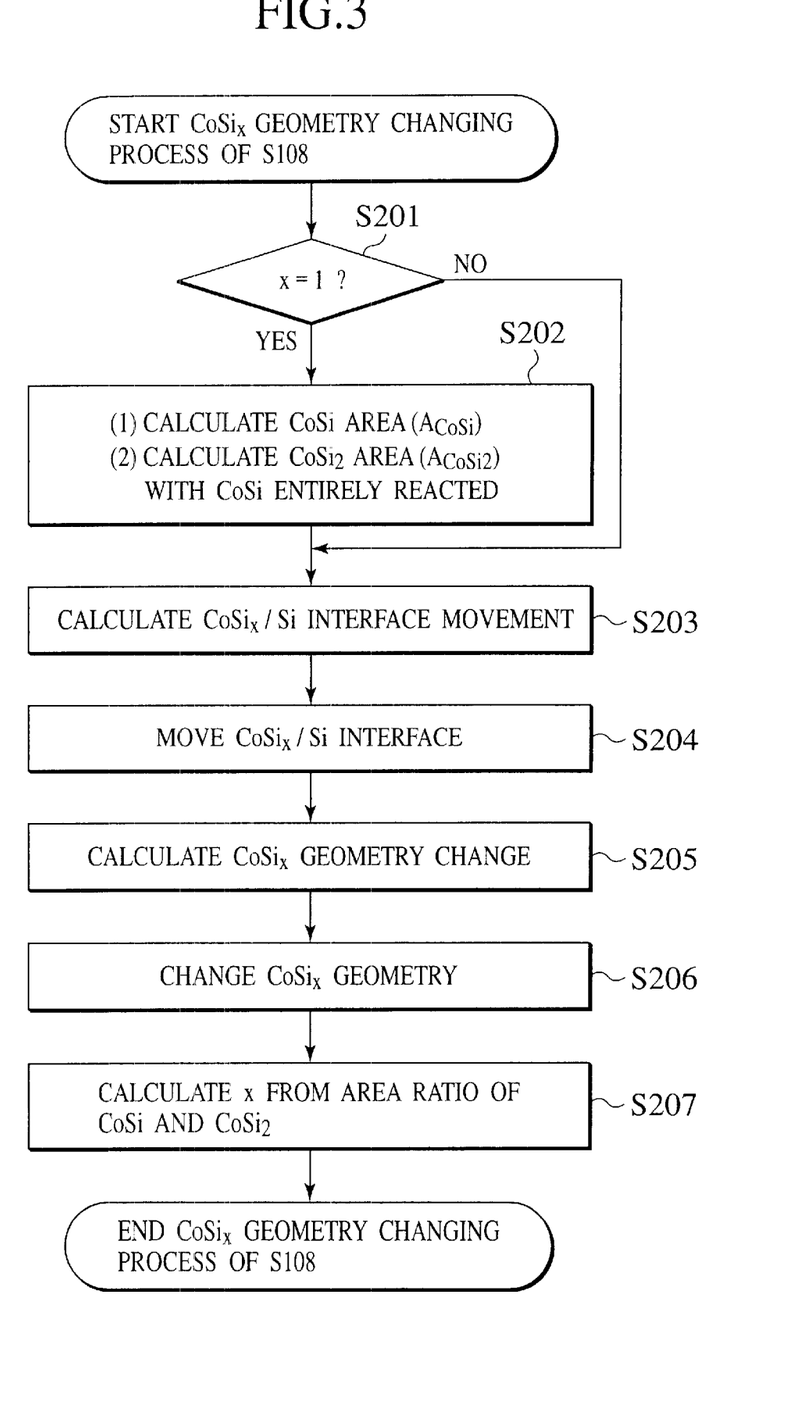
FIG. 3 is a flow, chart showing the details of step S108 of FIG. 2.

FIG. 3 is a flowchart showing the details of the $CoSi_x$/Si geometry changing process of step S108 of FIG. 2.

(I) Step S201 determines whether or not the variable x of $CoSi_x$ is 1. If x=1, step S202 calculates and stores an area $A_{CoSi}$ of the CoSi film and an area $A_{CoSi2}$ of a $CoSi_2$ film to be formed when the CoSi film having the area of $A_{CoSi}$ entirely reacts. If the variable x is not 1 in step S201, or after step S202, step S203 is carried out (II) Step S203 calculates the movement of each node on a $CoSi_x$—Si interface according to a silicide growing rate $dT_i/dt$ and a incremental time step Δt as follows:

$$dT_i/dt = k_i(C_i/N)n \quad (1)$$

where $T_i$ is a silicide film thickness growth, t is time, i is a node on the $CoSi_x$—Si interface, $k_i$ is a reaction speed coefficient on the $CoSi_x$—Si interface, N is the number of Co atoms contained in a unit silicide quantity, $C_i$ is a Co atom concentration on the $CoSi_x$ side of the $CoSi_x$—Si interface, and n is a vector perpendicular to the $CoSi_x$—Si interface. The Co atom concentration $C_i$ in the equation (1) is an unknown value and may be approximated by a Co equilibrium concentration in the $CoSi_x$ film, or may be obtained as a functional value based on the variable x of $CoSi_x$ and the Co equilibrium concentration.

(III) Step S204 moves the $CoSi_x$—Si interface according to the calculated node movements.

(IV) Step S205 calculates geometrical changes of the $CoSi_x$ film due to the silicide reaction on the $CoSi_x$—Si interface. The geometrical changes are calculable by solving a partial differential equation derived from a stress balancing equation and a substance constitutive equation. The substance constitutive equation is preferably based on a viscoelastic body, improving accuracy of the simulation.

(V) Step S206 changes the geometry of the $CoSi_x$ film according to the calculated geometry changes. According to the altered geometry of the $CoSi_x$ film, an area S of the $CoSi_x$ film is calculated.

(VI) Step S207 calculates a value of the variable x of $CoSi_x$ according to the current area $A_{CoSi2}$ of the $CoSi_x$ film and the areas $A_{CoSi}$ and $A_{CoSi2}$ calculated in step S202. For example, the variable x is calculated according to the following linear function:

$$x = 1 + (A_{CoSix} - A_{CoSi})/(A_{CoSi2} - A_{CoSi}) \quad (2)$$

Through the steps mentioned above, the geometries of the $CoSi_x$ film and Si region are pressed for every incremental time step Δt.

Figure 4A:
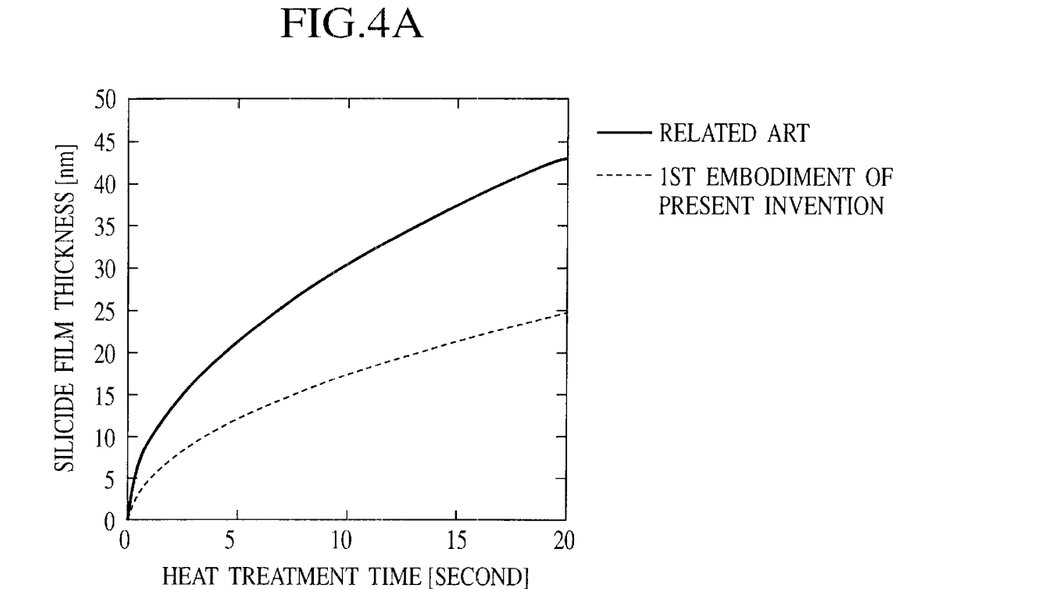
FIGS. 4A and 4B show simulation results of cobalt silicide film thicknesses according to the related art and the first embodiment.
Figure 4B:
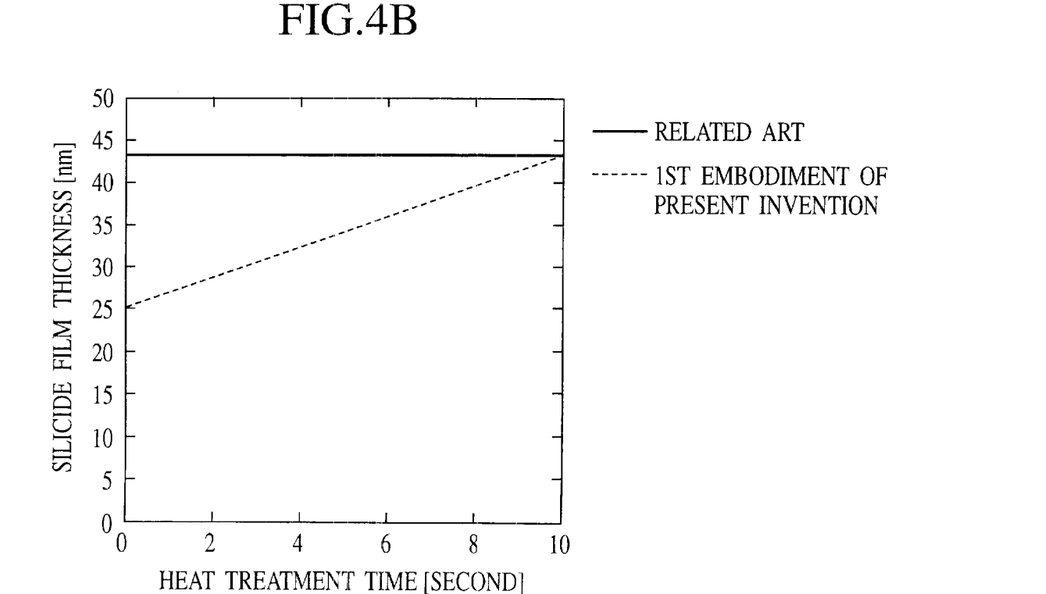

FIGS. 4(a) and 4(b) show simulation results of CoSix film thicknesses in the two step anneal of the cobalt SALICIDE process according to the first embodiment of the present invention and the related art. The related art is indicated with a continuous line and the first embodiment with a dotted line. Simulation conditions include depositing a Co film of 12.5 nm thick on a silicon substrate, carrying out a first heat treatment at 500° C. for 20 seconds, removing unreacted cobalt, and carrying out a second heat treatment at 800° C. for 10 seconds. Thickness changes in the silicide film during the first heat treatment are shown in FIG. 4(a), and thickness changes in the silicide film during the second heat treatment are shown in FIG. 4(b). Simulation conditions for the related art are adjusted so that a final element structure is obtained at the end of the first heat treatment.

As shown in FIGS. 4(a) and 4(b) there are great differences in in-process silicide thicknesses between the related art and the first embodiment even under the simulation conditions that finally provide the same silicide thickness. The thickness variations lead to variations in thermal stress occurring on peripheral structural elements and the geometries of the silicide film and peripheral structural elements.

Figure 5A:
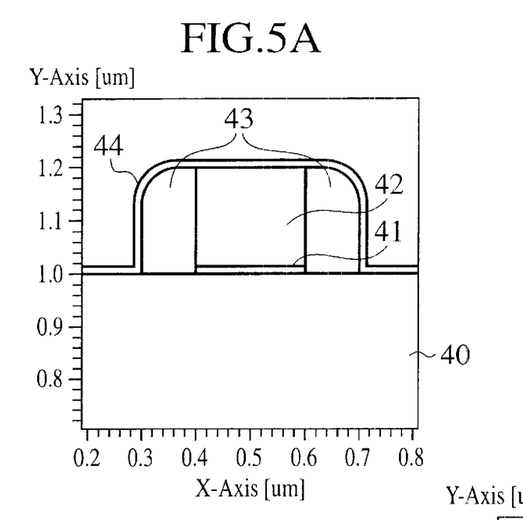
FIGS. 5A, 5B and 5C show simulation results of silicide films formed on a gate electrode and source/drain diffusion layer according to the first embodiment.
Figure 5B:
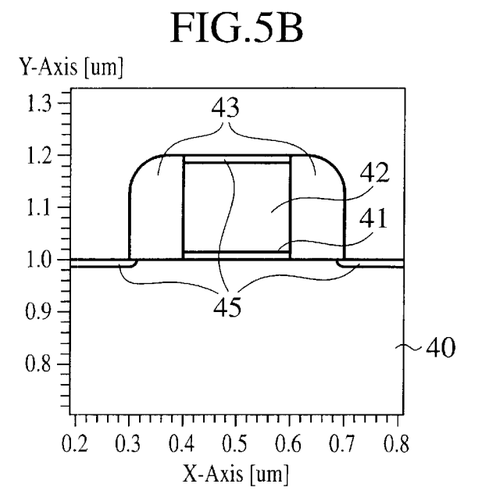
Figure 5C:
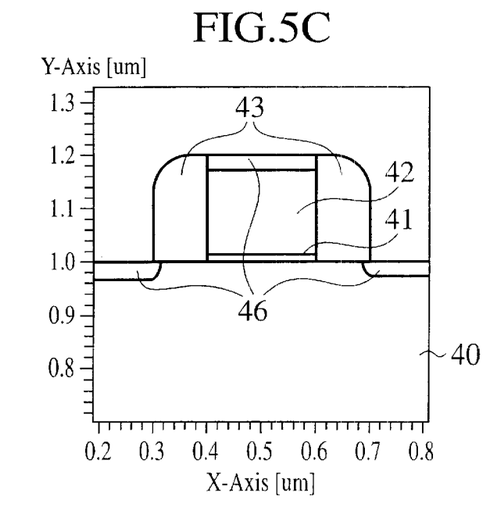

FIG. 5 shows a result of a SALICIDE simulation for forming a silicide film on a gate electrode and source/drain diffusion layer according to the first embodiment. FIG. 5(a) shows the geometry of an element just before the SALICIDE process, FIG. 5(b) shows a state after a first beat treatment and removing unreacted Co, and FIG. 5(c) shows a state after a second heat treatment.

In FIGS. 5(a) to 5(c), a gate oxide film 41 is formed on a silicon substrate 40, and a polysilicon gate 42 is formed on the gate oxide film 41. On each side of the gate oxide film 41 and polysilicon gate 42, a nitride film 43 is formed as a side wall. In FIG. 4(a), a cobalt (Co) film 44 is deposited over the silicon substrate 40, polysilicon gate 42, and nitride films 43. In FIGS. 4(b) and 4(c), a monosilicide (CoSi) film 45 or a disilicide ($CoSi_2$) film 46 is formed on the silicon substrate 40 and polysilicon gate 42. In FIGS. 5(a) to 5(c), scales on an ordinate and abscissa are used to measure element dimensions. The scales are also used as references to set nodes for simulating the SALICIDE process.

As shown in FIGS. 5(a) to 5(c), the first embodiment separately simulates the beat treatments of the SALICIDE process and evaluates and manages element geometries by means of a monitor after each heat treatment.

As explained above, the first embodiment simulates the SALICIDE process by separately considering silicide reactions occurring in the first and second heat treatments, thereby improving the simulation accuracy of silicide film thicknesses and element geometries and the calculation correctness of interface movements, stress, and point defects caused by silicide reactions. As a result, the first embodiment is capable of reducing the numbers of process parameters, prototypes, and tests, shortening the development period, and increasing development efficiency. The effect of the first embodiment will be achieved even if the heat treatment conditions of the SALICIDE process are changed.

Although the first embodiment has been explained with reference to the cobalt SALICIDE process, the present invention is also applicable to a SALICIDE process employing other metal such as nickel (Ni). Although the first embodiment handles two-dimensional analysis regions, the present invention is also applicable to the handling of three dimensional analysis regions by replacing each area with a volume. Although the first embodiment handles a single silicide region having a compositional variable x, the present invention is capable of simulating each of sections divided from a silicide region by setting $CoSi_x$ for each section.

Although the first embodiment changes the compositional variable x of a silicide $M_ySi_x$, the present invention is capable of simulating a silicide $M_ySi_x$ with both the variables x and y being changed. The first embodiment fixes the variable y to 1 and changes the variable x in the range of 1 and 2 when simulating a silicide $M_ySi_x$. Instead, the variable y may also be changed to improve user's benefits and make simulations more versatile.

The SALICIDE simulation steps according to the first embodiment may be represented with a series of procedures that are temporally continuous. Namely, the simulation steps may be replaced with a computer program that specifies functions to be executed by computer. The computer program may be stored in a computer readable recording medium. The recording medium is read and executed by computer to control and achieve the simulation steps. The recording medium may include a memory device, a magnetic disk drive, an optical disk drive, or any other drive capable of recording programs.

A series of the processes and operations of FIGS. 2 and 3 is stored as a computer program executable by computer in a recording medium readable by computer. The recording medium may be a semiconductor memory, a magnetic disk, an optical disk a magnetic tape, or any other medium capable of recording programs.

Figure 6:
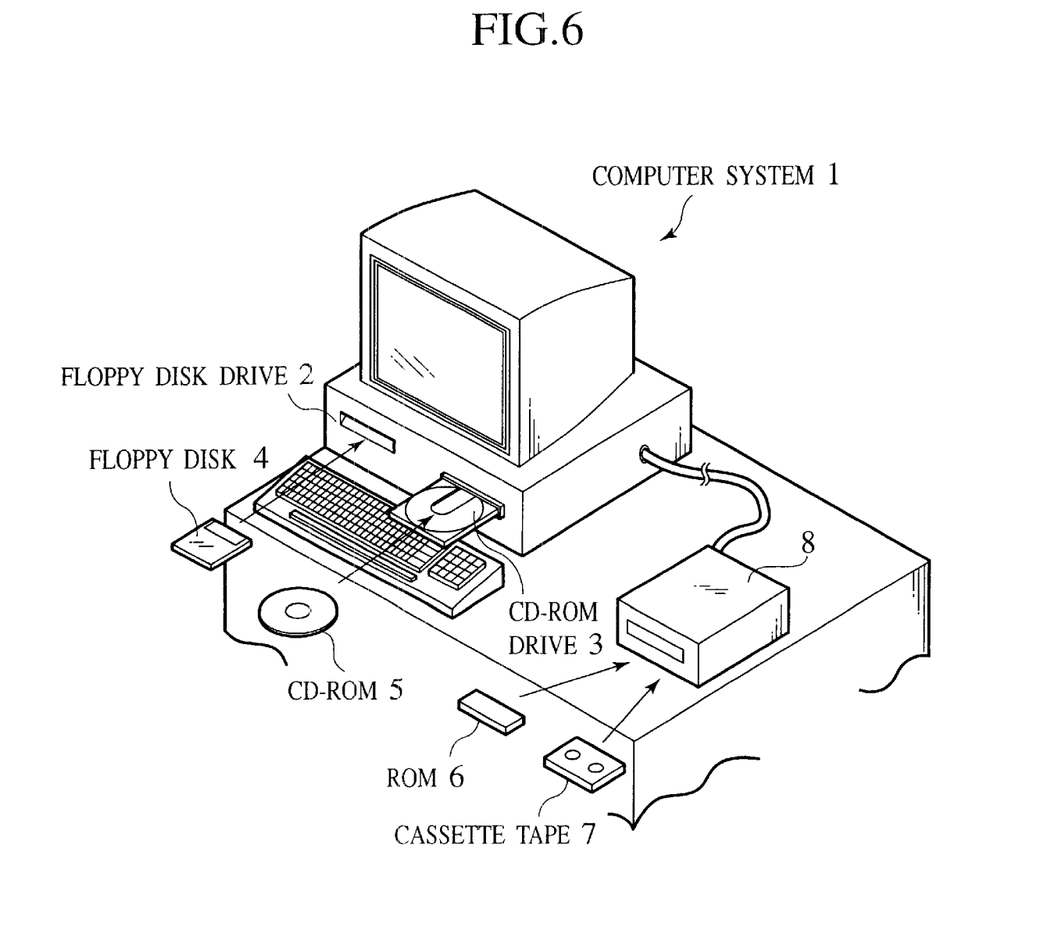
FIG. 6 is a perspective view showing a simulator and recording media according to the first embodiment.

FIG. 6 is a perspective view showing an example of a process simulator that reads a simulation program prepared according to the first embodiment, controls the functions of a computer according to procedures described in the program, and carries out a simulation. The process simulator 1, which is a computer, has a floppy disk drive 2 and a CD-ROM drive 3. A floppy disk 4 or a CD-ROM 5 containing the simulation program is inserted into the corresponding drive, and the program is read and installed in the computer. A drive 8 may be connected to the computer, to use a game-pack ROM 6 or a magnetic cassette tape 7.

Second Embodiment

Figure 7:
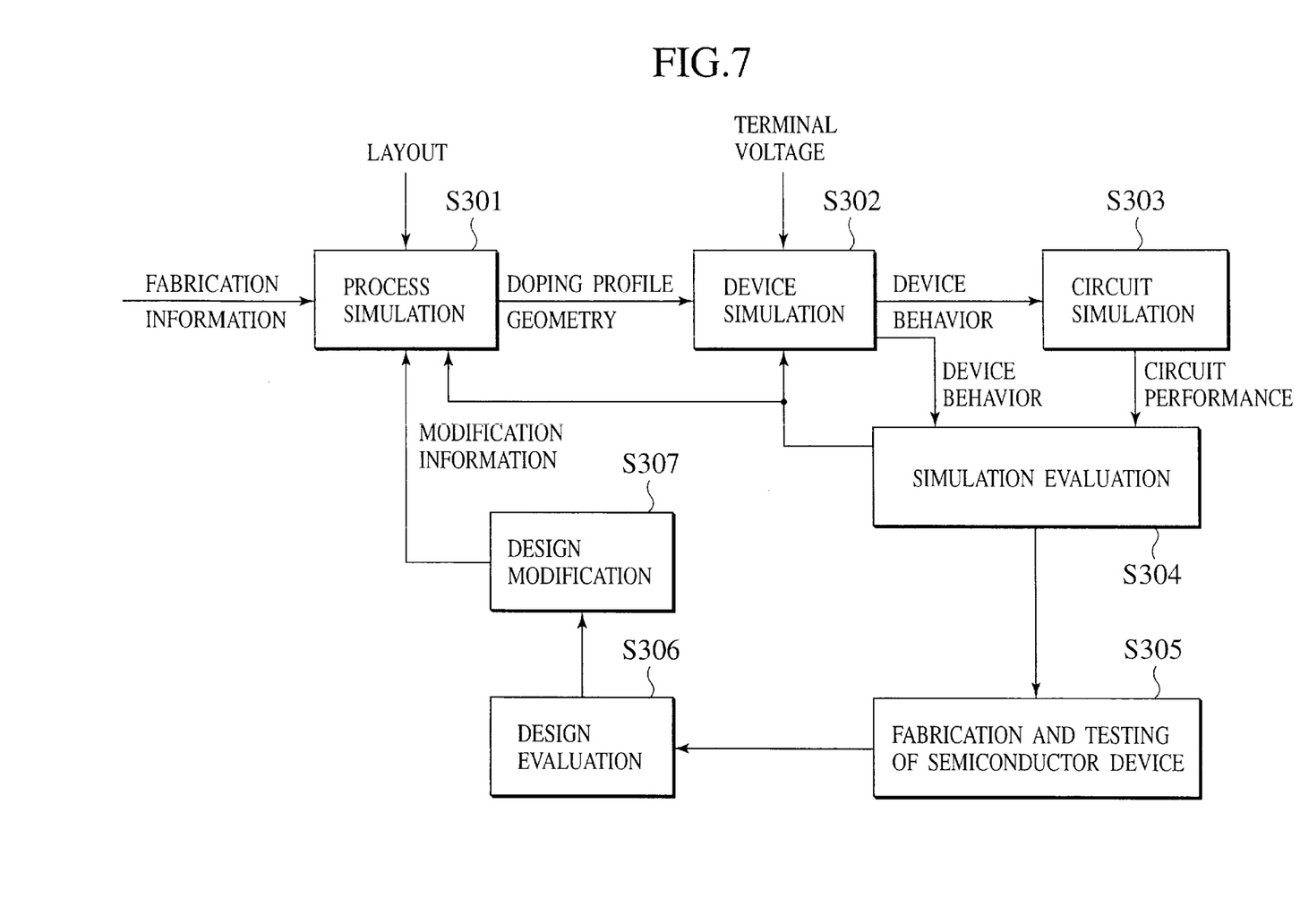
FIG. 7 is a flowchart of a semiconductor device manufacturing method according to a second embodiment of the present invention.

FIG. 7 is a flowchart showing a method of manufacturing a semiconductor device according to the second embodiment of the present invention. This method employs the silicide process simulation method of the first embodiment (a) Step S301 employs the process simulator 1 (FIG. 6) to carry out the simulation method of the first embodiment Namely, step S301 sets a finite number of nodes in and around semiconductor elements of the semiconductor device to be manufactured, checks a contact state between a $CoSi_x$ film and an Si region or a Co film, a heat treatment temperature, a variable x in $CoSi_x$ etc., calculates silicide reactions, and changes the geometries of the $CoSi_x$ film, etc. The process simulation of step S301 uses layout data and process data related to the semiconductor device and provides data related to the structures, impurities, and defect distributions of semiconductor elements of the semiconductor device. The data from the process simulation is supplied to a device simulator.

(b) Step S302 carries out a device simulation according to the data provided by the process simulation The data includes the structure, impurity distributions, etc, of the semiconductor elements and positional relationships among the Co film, silicide film, and Si region. The device simulation of step S302 also uses input data including electric boundary conditions such as applied voltages and currents. The device simulation provides the electric characteristics such as current-voltage characteristics, impedance characteristics, and high-frequency characteristics of the semiconductor device. If required, the device characteristics provided by the device simulation may be used for a circuit simulation carried out in step S303 to provide circuit characteristics.

(c) Step S304 checks to see if the electric characteristics provided by the device simulation of step S302 or the circuit simulation of step S303 are satisfactory If they are satisfactory, the semiconductor device is actually fabricated.

(d) Step S305 fabricates an actual semiconductor device. This step includes a SALICIDE process for forming a silicide film over gate electrodes or source/drain diffusion layers. The SALICIDE process is carried out according to process parameters including first and second heat treatment temperatures and periods, an initial Co film thickness, etc, provided by the process simulation of step S301.

Step S305 may include an impurity doping process involving thermal diffusion and ion implantation to dope a semiconductor material with impurities, a shaping process involving photolithography and dry etching to shape a semiconductor substrate and thin films, and a film forming process involving epitaxial growth, CVD, vacuum vapor deposition, and spattering. With a combination of these processes, step S305 fabricates the semiconductor device.

If step S304 determines that the characteristics of the semiconductor device are unsatisfactory, the planned processes are unable to manufacture required elements for the semiconductor device. In this case, process parameters are changed, or fabrication processes are modified or rearranged, and step S301 or S302 is repeated. If step S301 is repeated, it provides a process simulation result, which is used for a device simulation in step S302 Step S305 measures the electric characteristics of the actually fabricated semiconductor device.

(e) Step S306 determines whether or not the electric characteristics of the semiconductor device measured in step S305 satisfy required specifications. If they are unsatisfactory, step S307 changes design, and a loop including step S301 to carry out a process simulation, step S302 to carry out a device simulation according to a result of the process simulation, etc., is repeated.

Semiconductor industries are competing for shortening study, designing, and development periods. Such circumstances need speedy and correct semiconductor device simulations. The second embodiment is capable of speedily achieving precision simulations, to drastically shorten semiconductor device study, designing, and development periods.

Additional advantages and modifications of the present invention will readily be apparent to those skilled in the art Therefore, the scope of the present invention is not limited to the specific details and representative embodiments shown and described herein. Accordingly, various modifications may be made without departing from the spirit or scope of the general inventive concept as defined by the appended claims and their equivalents.

What is claimed is:

1. A semiconductor device simulation method comprising:
    a first step of determining whether or not a silicide region made of a metal and silicon is in contact with a silicon region and a metal region;
    a second step of determining, if the silicide region is in contact with the silicon and metal regions, species diffusing through the silicide region according to a temperature heating the silicide, silicon, and metal regions and a composition of the silicide region;
    a third step of finding, if the species diffusing through the silicide region is silicon, positional relationships among the silicide, silicon, and metal regions according to a first diffusion equation expressing diffusion of silicon through the silicide region and geometry changing equations expressing geometric changes of the silicide, silicon, and metal regions; and
    a fourth step of finding, if the species diffusing through the silicide region is the metal, positional relationships among the silicide, silicon, and metal regions according to a second diffusion equation expressing diffusion of the metal through the silicide region and geometry changing so equations expressing geometric changes of the silicide, silicon, and metal regions.

2. The method of claim 1, wherein the metal is cobalt (Co).

3. The method of claim 2, wherein:
    the composition of the silicide region is $Co_ySi_x$;
    the third step calculates the first diffusion equation if y=1 and x=1 in $Co_ySi_x$; and
    the fourth step calculates the second diffusion equation if y=1 and x=2 in $Co_ySi_x$.

4. The method of claim 2, wherein:
    the composition of the silicide region is $Co_ySi_x$;
    the third step calculates the first diffusion equation if y=1 and x=2 in $Co_ySi_x$ and if the temperature heating the silicide, silicon, and metal regions is less than a set temperature; and
    the fourth step calculates the second diffusion equation if y=1 and x=2 in $Co_ySi_x$, or if the temperature heating the silicide, silicon, and metal regions is the set temperature or more.

5. The method of claim 1, wherein:
    the second step determines, if the silicide region is in contact with the silicon and metal regions, whether a silicide to be formed is a monosilicide or a disilicide according to the temperature heating the silicide, silicon, and metal regions and the composition of the silicide region;
    the third step finds, if the monosilicide is formed, positional relationships among the silicide, silicon, and metal regions according to the first diffusion equation and the geometry changing equations; and
    the fourth step finds, if the disilicide is formed, positional relationships among the silicide, silicon, and metal regions according to the second diffusion equation and the geometry changing equations.

6. The method of claim 1, further comprising:

a fifth step of finding, if the first step determines that the silicide region is in contact with the silicon region and is not in contact with the metal region, positional relationships between the silicide region and the silicon region according to a compositional change in the silicide region and the geometry changing equations expressing geometric changes of the silicide and silicon regions and changing the composition of the silicide region according to the found positional relationships.

7. The method of claim 6, wherein:

the metal is cobalt (Co);

the composition of the silicide region is $Co_ySi_x$; and the fifth step is carried out with y=1 and 1<=x<2 in $Co_ySi_x$.

8. A semiconductor device simulator comprising:

a first section configured to determine whether or not a silicide region made of a metal and silicon is in contact with a silicon region and a metal region;

a second section configured to determine, if the silicide region is in contact with the silicon and metal regions, species diffusing through the silicide region according to a temperature heating the silicide, silicon, and metal regions and a composition of the silicide region;

a third section configured to find, if the species diffusing through the silicide region is silicon, positional relationships among the silicide, silicon, and metal regions according to a first diffusion equation expressing diffusion of silicon through the silicide region and geometry changing equations expressing geometric changes of the silicide, silicon, and metal regions; and a fourth section configured to find, if the species diffusing through the silicide region is the metal, positional relationships among the silicide, silicon, and metal regions according to a second diffusion equation expressing diffusion of the metal through the silicide region and geometry changing equations expressing geometric changes of the silicide, silicon, and metal regions.

9. The simulator of claim 8, further comprising:

a fifth section configured to find, if the first section determines that the silicide region is in contact with the silicon region and is not in contact with the metal region, positional relationships between the silicide region and the silicon region according to a compositional change in the silicide region and the geometry changing equations expressing geometric changes of the silicide and silicon regions and changing the composition of the silicide region according to the found positional relationships.

10. The simulator of claim 8, wherein:

the second section determines, if the silicide region is in contact with the silicon and metal regions, whether a silicide to be formed is a monosilicide or a disilicide according to the temperature heating the silicide, silicon, and metal regions and the composition of the silicide region;

the third section finds, if the monosilicide is formed, positional relationships among the silicide, silicon, and metal regions according to the first diffusion equation and the geometry changing equations; and the fourth section finds, if the disilicide is formed, positional relationships among the silicide, silicon, and metal regions according to the second diffusion equation and the geometry changing equations.

11. A computer program for semiconductor device simulation, comprising:

a first computer readable program code which determines whether or not a silicide region a made of a metal and silicon is in contact with a silicon region and a metal region;

a second computer readable program code which determines, if the silicide region is in contact with the silicon and metal regions, species diffusing through the silicide region according to a temperature heating the silicide, silicon, and metal regions and a composition of the silicide region;

a third computer readable program code which finds, if the species diffusing through the silicide region is silicon, positional relationships among the silicide, silicon, and metal regions according to a first diffusion equation expressing diffusion of silicon through the silicide region and geometry changing equations expressing geometric changes of the silicide, silicon, and metal regions; and a fourth computer readable program code which finds, if the species diffusing through the silicide region is the metal, positional relationships among the silicide, silicon, and metal regions according to a second diffusion equation expressing diffusion of the metal through the silicide region and geometry changing equations expressing geometric changes of the silicide, silicon, and metal regions.

12. The computer program of claim 11, further comprising:

a fifth computer readable program code which finds, if the first computer readable program code determines that the silicide region is in contact with the silicon region and is not in contact with the metal region, positional relationships between the silicide region and the silicon region according to a compositional change in the silicide region and the geometry changing equations expressing geometric changes of the silicide and silicon regions and changing the composition of the silicide region according to the found positional relationships.

13. The computer program of claim 11, wherein:

the second computer readable program code determines, if the silicide region is in contact with the silicon and metal regions, whether a silicide to be formed is a monosilicide or a disilicide according to the temperature heating the silicide, silicon, and metal regions and the composition of the silicide region;

the third computer readable program code finds, if the monosilicide is formed, positional relationships among the silicide, silicon, and metal regions according to the first diffusion equation and the geometry changing equations; and the fourth computer readable program code finds, if the disilicide is formed, positional relationships among the silicide, silicon, and metal regions according to the second diffusion equation and the geometry changing equations.

14. A method of manufacturing a semiconductor device, comprising:

a first procedure including:

a first act of determining whether or not a silicide region made of a metal and silicon is in contact with a silicon region and a metal region;

a second act of determining, if the silicide region is in contact with the silicon and metal regions, species diffusing through the silicide region according to a temperature heating the silicide, silicon, and metal regions and a composition of the silicide region;

a third act of finding, if the species diffusing through the silicide region is silicon, positional relationships among the silicide, silicon, and metal regions according to a first diffusion equation expressing silicon diffusing through the silicide region and geometry changing equations expressing geometric changes of the silicide, silicon, and metal regions; and a fourth act of finding, if the species diffusing through the silicide region is the metal, positional relationships among the silicide, silicon, and metal regions according to a second diffusion equation expressing the metal diffusing through the silicide region and geometry changing equations expressing geometric changes of the silicide, silicon, and metal regions;

a second procedure of finding electric characteristics of the semiconductor device according to given electric boundary conditions and semiconductor element structural data based on the found positional relationships; and a third procedure of executing a series of manufacturing processes including a silicide process on a semiconductor material according to a result of evaluation of the found electric characteristics, to manufacture the semiconductor device.

15. The method of claim 14, wherein the metal is cobalt (Co).

16. The method of claim 15, wherein:

the composition of the silicide region is $Co_y Si_x$;

the third act calculates the first diffusion equation if $y=1$ and $x=1$ in $Co_y Si_x$; and the fourth act calculates the second diffusion equation if $y=1$ and $x=2$ in $Co_y Si_x$.

17. The method of claim 15, wherein:

the composition of the silicide region is $Co_y Si_x$;

the third act calculates the first diffusion equation if $y=1$ and $x \neq 2$ in $Co_y Si_x$ and if the temperature heating the silicide, silicon, and metal regions is less than a set temperature; and the fourth act calculates the second diffusion equation if $y=1$ and $x=2$ in $Co_y Si_x$, or if the temperature heating the silicide, silicon, and metal regions is the set temperature or more.

18. The method of claim 14, wherein:

the second act determines, if the silicide region is in contact with the silicon and metal regions, whether a silicide to be formed is a monosilicide or a disilicide according to the temperature heating the silicide, silicon, and metal regions and the composition of the silicide region;

the third act finds, if the monosilicide is formed, positional relationships among the silicide, silicon, and metal regions according to the fist diffusion equation and the geometry changing equations; and the fourth act finds, if the disilicide is formed, positional relationships among the silicide, silicon, and metal regions according to the second diffusion equation and the geometry changing equations.

19. The method of claim 14, wherein the first procedure further includes:

a fifth act of finding, if the first act determines that the silicide region is in contact with the silicon region and is not in contact with the metal region, positional relationships between the silicide region and the silicon region according to a compositional change in the silicide region and the geometry changing equations expressing geometric changes of the silicide and silicon regions and changing the composition of the silicide region according to the found positional relationships.

20. The method of claim 19, wherein:

the metal is cobalt (Co);

the composition of the silicide region is $Co_y Si_x$; and the fifth act is carried out with $y=1$ and $1<=x<2$ in $Co_y Si_x$.

* * * * *

UNITED STATES PATENT AND TRADEMARK OFFICE
CERTIFICATE OF CORRECTION

PATENT NO. : 6,467,066 B2  
DATED : October 15, 2002  
INVENTOR(S) : Kusunoki

It is certified that error appears in the above-identified patent and that said Letters Patent is hereby corrected as shown below:

Title page,  
Item [57], ABSTRACT,  
Lines 2-3, change "temperature" to -- temperatures --.

Column 10,  
Line 32, change "changing so" to -- changing --.  
Line 46, change "x=2" to -- $x \neq 2$ --.

Column 12,  
Line 4, change "region a" to -- region --.

Column 14,  
Line 16, change "fist" to -- first --.

Signed and Sealed this

Eighteenth Day of March, 2003

JAMES E. ROGAN  
*Director of the United States Patent and Trademark Office*